United States Patent
Ikegawa et al.

(10) Patent No.: US 7,015,472 B2
(45) Date of Patent: Mar. 21, 2006

(54) INFRARED RAY DETECTING TYPE IMAGING DEVICE

(75) Inventors: Sumio Ikegawa, Musashino (JP); Kohei Nakayama, Kawasaki (JP); Hideyuki Funaki, Tokyo (JP); Yoshinori Iida, Tokyo (JP); Keitaro Shigenaka, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 136 days.

(21) Appl. No.: 11/063,545

(22) Filed: Feb. 24, 2005

(65) Prior Publication Data

US 2005/0139774 A1  Jun. 30, 2005

Related U.S. Application Data

(62) Division of application No. 10/392,826, filed on Mar. 21, 2003.

(30) Foreign Application Priority Data

Mar. 22, 2002  (JP)  ............................. 2002-081795

(51) Int. Cl.
*H01L 31/062* (2006.01)
*H01L 31/113* (2006.01)
*H01L 31/058* (2006.01)

(52) U.S. Cl. .................... 250/338.1; 250/332; 250/352

(58) Field of Classification Search ............ 250/338.1, 250/338.3, 338.4, 332, 352
See application file for complete search history.

(56) References Cited

U.S. PATENT DOCUMENTS

| 4,224,520 A | 9/1980 | Greene et al. |
| 5,554,849 A | 9/1996 | Gates |
| 5,858,902 A | 1/1999 | Ishikawa et al. |
| 5,965,886 A * | 10/1999 | Sauer et al. ................. 250/332 |
| 6,031,231 A | 2/2000 | Kimata et al. |
| 6,188,069 B1 * | 2/2001 | Endoh ...................... 250/338.1 |
| 6,274,869 B1 * | 8/2001 | Butler ...................... 250/338.1 |
| 6,441,413 B1 * | 8/2002 | Endoh ......................... 257/293 |
| 6,635,495 B1 | 10/2003 | Hashimoto et al. |
| 2002/0040967 A1 * | 4/2002 | Oda ......................... 250/338.1 |

FOREIGN PATENT DOCUMENTS

JP  07-146187  6/1995

(Continued)

OTHER PUBLICATIONS

J. B. Torrance et al., "Systematic Study of Insulator-Metal Transitions in Perovskites $RNiO_3$ (R=Pr, Nd, Sm, Eu) Due to Closing of Charge-Transfer Gap", Physical Review B, vol. 45, No. 14, Apr. 1, 1992-II, pp. 8209-8212.

(Continued)

*Primary Examiner*—David Porta
*Assistant Examiner*—Faye Polyzos
(74) *Attorney, Agent, or Firm*—Oblon, Spivak, McClelland, Maier & Neustadt, P.C.

(57) ABSTRACT

An imaging device comprises a select line, a first signal line crossing the select line, and a first pixel provided at a portion corresponding to a crossing portion of the select line and the first signal line, the first pixel comprising a first buffer layer formed on a substrate, a first bolometer film formed on the first buffer layer, made of a compound which undergoes metal-insulator transition, and generating a first temperature detection signal, a first switching element formed on the substrate, selected by a select signal from the select line, and supplying the first temperature detection signal to the first signal line, and a metal wiring connecting a top surface of the first bolometer film to the first switching element.

13 Claims, 12 Drawing Sheets

FOREIGN PATENT DOCUMENTS

| JP | 09-268061 | 10/1997 |
|---|---|---|
| JP | 2000-055737 | 2/2000 |
| JP | 2000-097765 | 4/2000 |
| JP | 2000-111397 | 4/2000 |

OTHER PUBLICATIONS

C. S. Alexander et al., "Destruction of the Mott Insulating Ground State of $Ca_2RuO_4$ by a Structural Transition", Physical Review B, vol. 60, No. 12, Sep. 15, 1999-II, pp. R8422-R8425.

G. Cao et al., "Ground-State Instability of the Mott Insulator $Ca_2RuO_4$: Impact of Slight LA Doping on the Metal-Insulator Transition and Magnetic Ordering", Physical Review B, Condensed Matter and Materials Physics, Third Series, vol. 61, No. 8 Feb. 15, 2000-II, pp. R5053-5057.

G. Catalan et al., "Transport Properties of $NdNiO_3$ Thin Films Made by Pulsed-Laser Deposition", Journal of Applied Physics, vol. 87, No. 1, Jan. 1, 2000, pp. 606-608.

M. A. Novojilov et al., "Perovskite Rare-Earth Nickelates in the Thin-Film Epitaxial State", Applied Physics Letters, vol. 76, No. 15, Apr. 10, 2000, pp. 2041-2043.

R. A. McKee et al., "Crystalline Oxides on Silicon: The First Five Monolayers", Physical Review Letters, vol. 81, No. 14, Oct. 5, 1998, pp. 3014-3017.

I. Mizushima et al., "Empty-Space-In-Silicon Technique for Fabricating a Silicon-on-Nothing Structure", Applied Physics Letters, vol. 77, No. 20, Nov. 13, 2000, pp. 3290-3292.

* cited by examiner

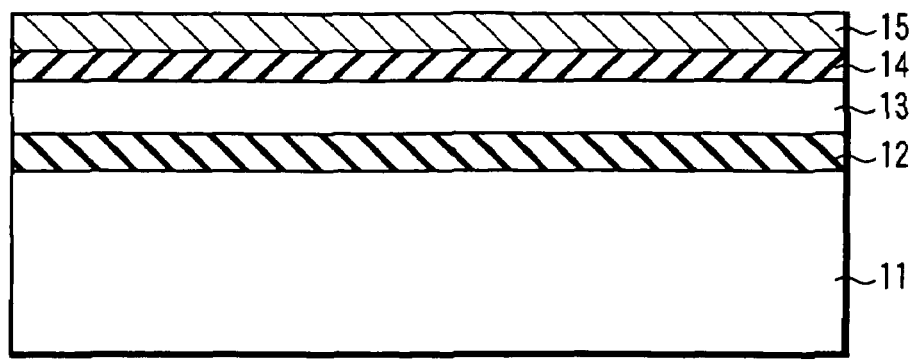
F I G. 4A
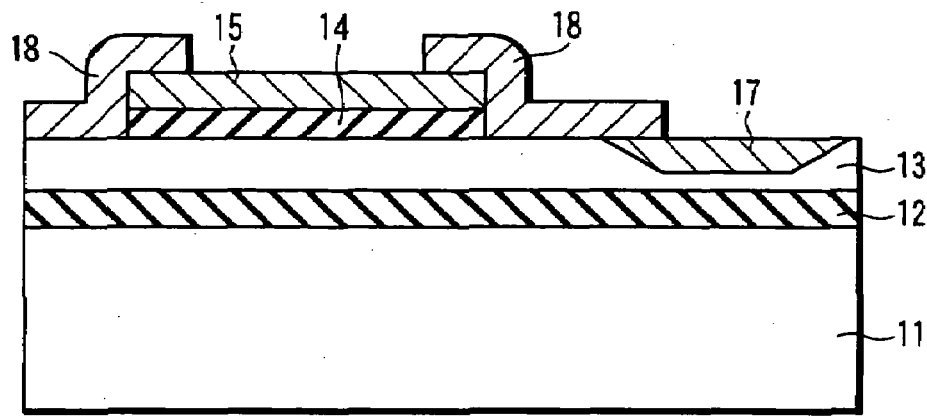
F I G. 4B
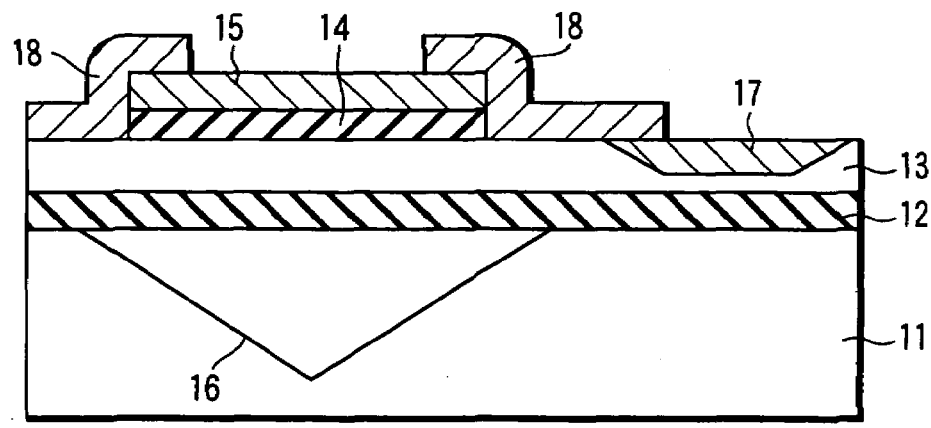
F I G. 4C

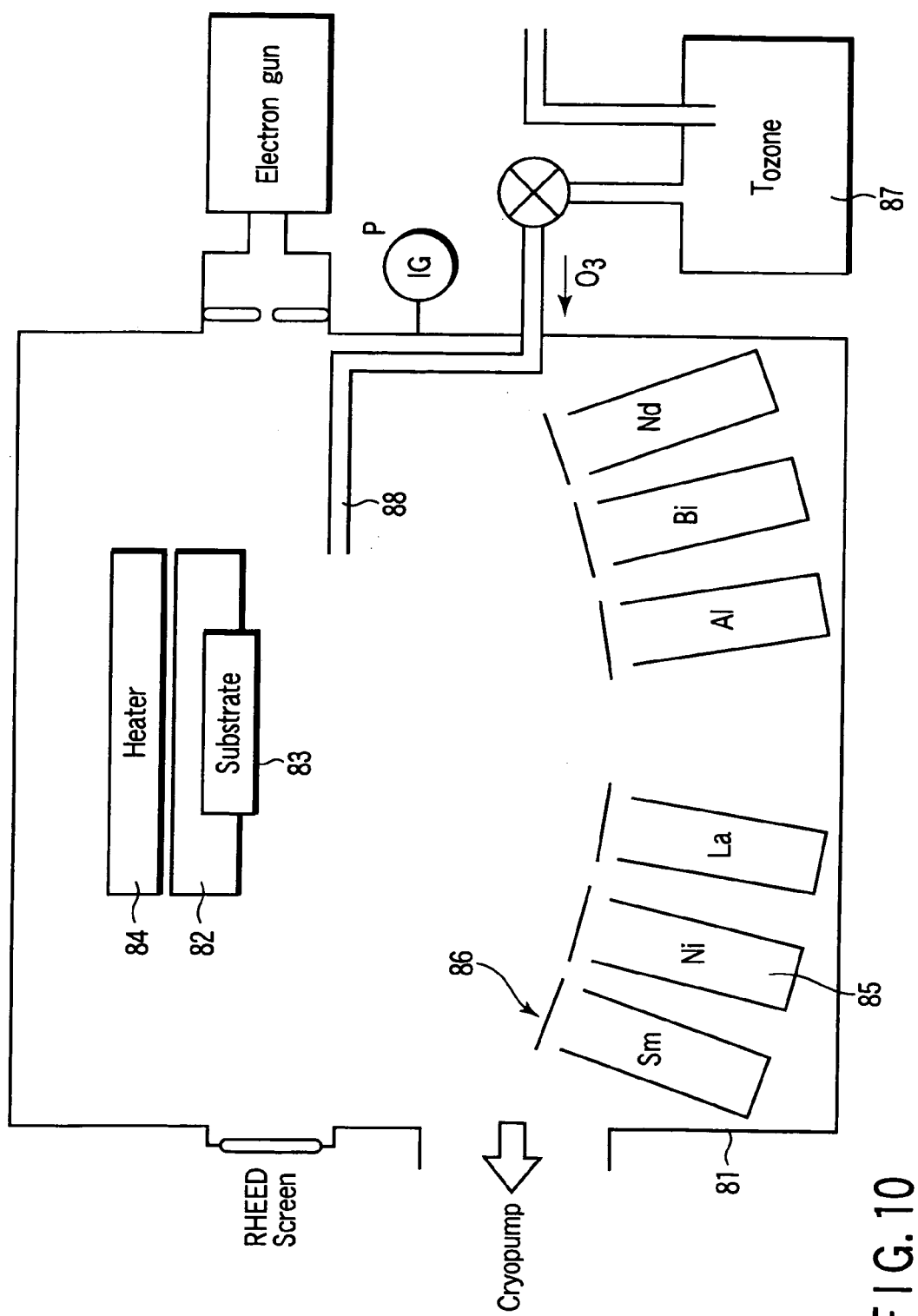
F I G. 10

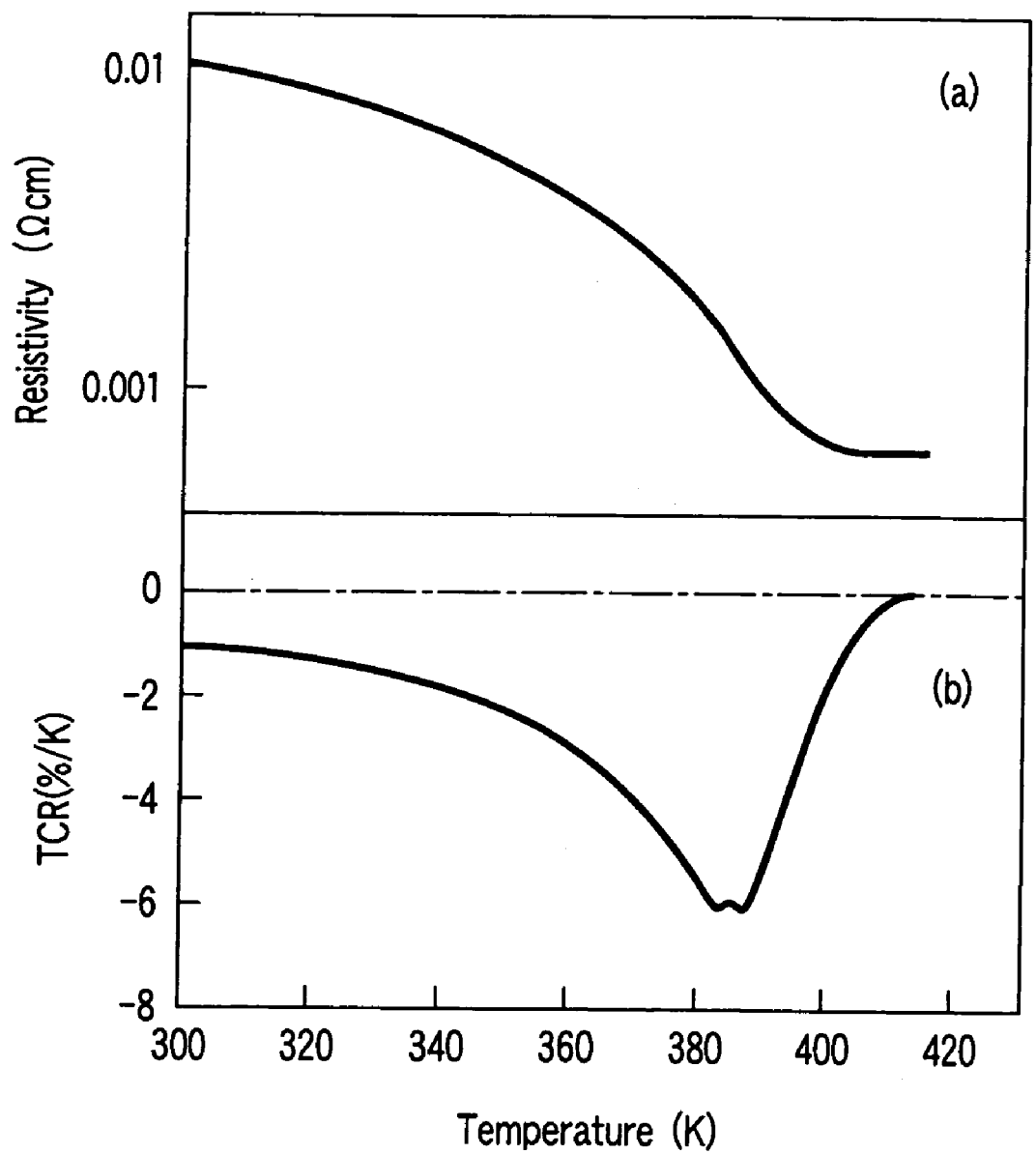
F I G. 11

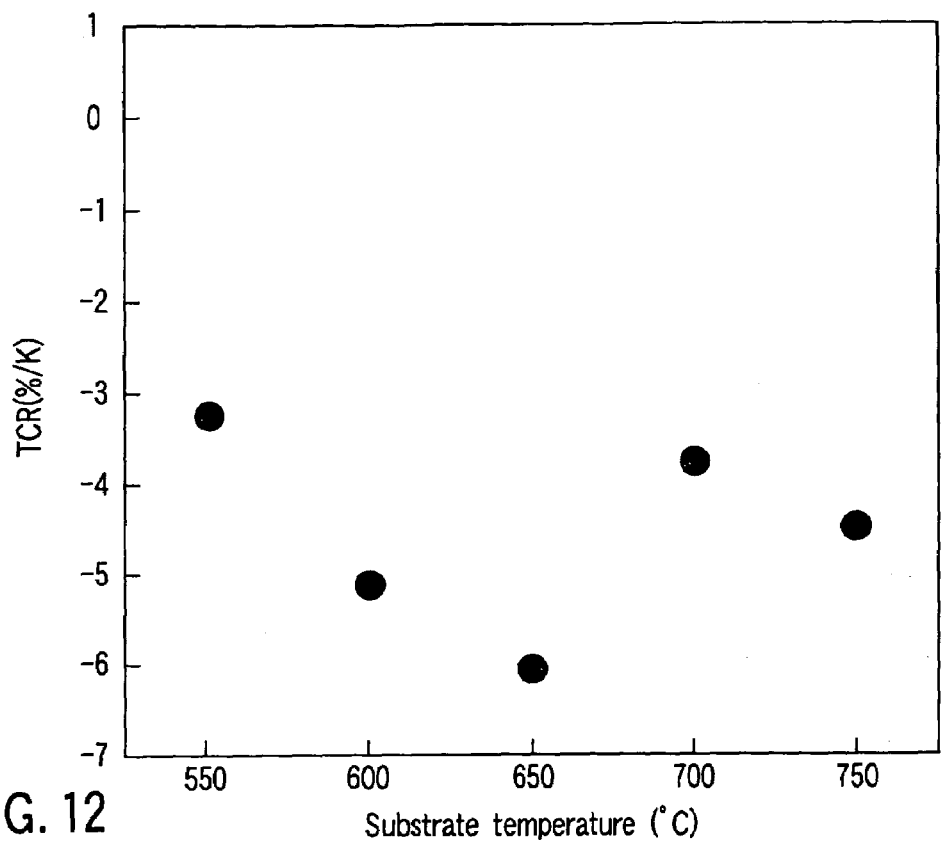
F I G. 12
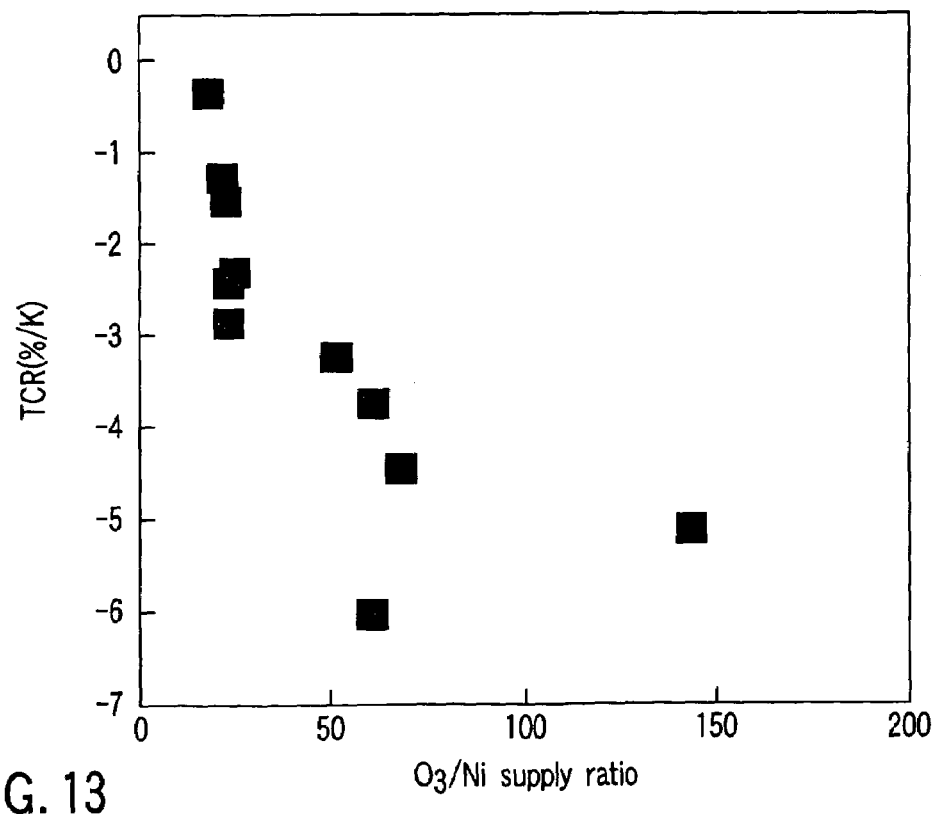
F I G. 13

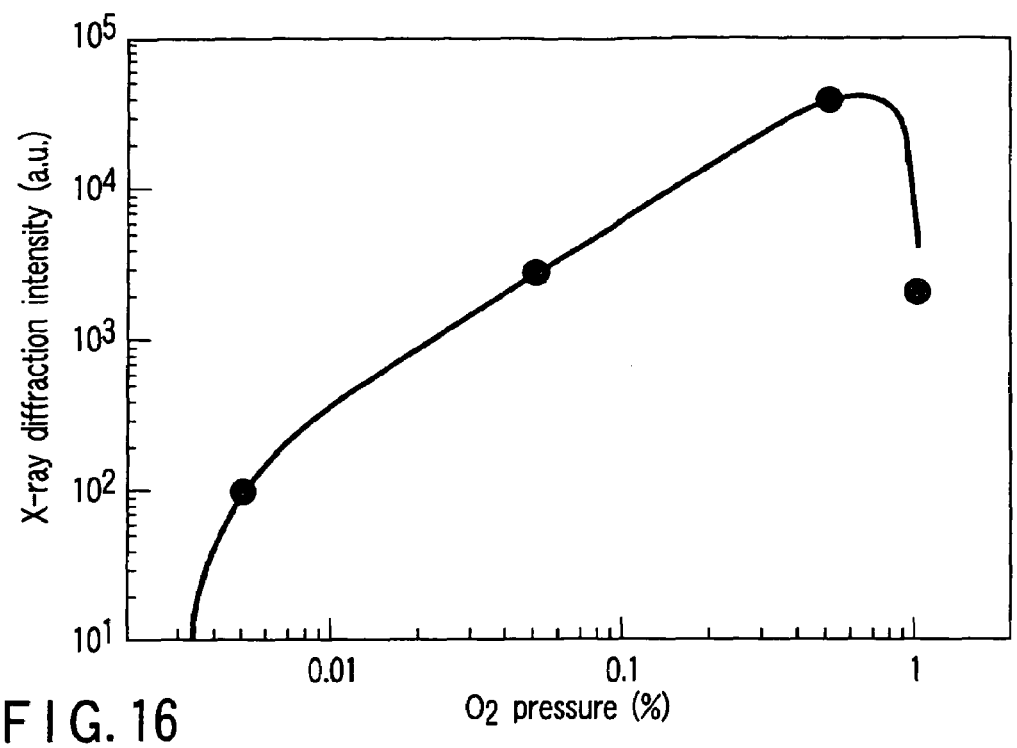
F I G. 16
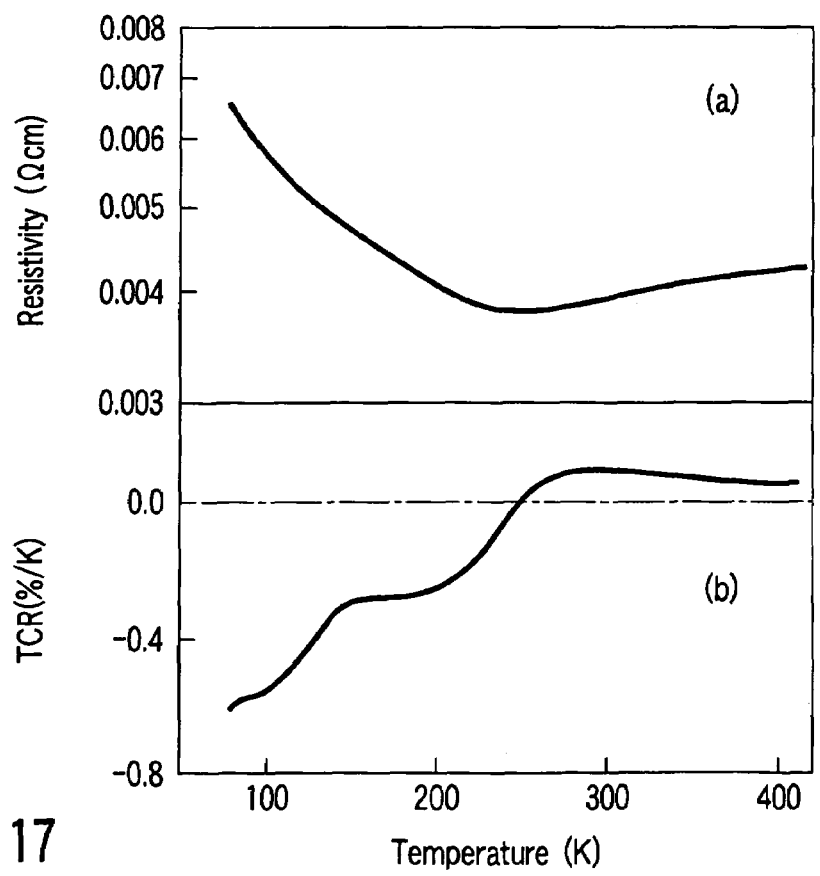
F I G. 17

INFRARED RAY DETECTING TYPE IMAGING DEVICE

CROSS-REFERENCE TO RELATED APPLICATIONS

This application is a divisional of U.S. application Ser. No. 10/392,826, filed Mar. 21, 2003, and is based upon and claims the benefit of priority from the prior Japanese Patent Application No. 2002-81795, filed Mar. 22, 2002, the entire contents of each of which is incorporated herein by reference.

BACKGROUND OF THE INVENTION

1. Field of the Invention

The present invention relates to an imaging device and a method of manufacturing the same, and more particularly to an infrared ray detecting type imaging device (an infrared imaging device) and a method of manufacturing the same.

2. Description of the Related Art

An infrared imaging device is proposed, in which a bolometer film is formed on a semiconductor substrate on which a circuit including transistor and wiring and the like is formed. This device detects an infrared ray for each pixel by making use of change of a resistance value of the bolometer film depending on temperature, and reads the detected signal by way of the transistor. In the conventional infrared imaging device, first, a circuit portion including a transistor and a metal wiring such as an aluminum wiring is formed on a semiconductor substrate, and then a bolometer film is formed thereon.

In such an infrared imaging device, however, the process temperature when forming a bolometer film must be about 450° C. or less, preferably about 400° C. or less. If the process temperature is higher, the metal wiring such as an aluminum wiring deteriorates. Further, by heat treatment at high temperature of about 800° C. or more, the transistor characteristic also deteriorates. Conventional films such as vanadium oxide films can be formed at relatively low temperature, and there is no problem, but when a material requiring to be formed at high temperature is used as a bolometer film, the metal wiring and transistors deteriorate. Therefore, in the conventional infrared imaging device, materials usable for the bolometer film are limited.

Hitherto, moreover, there are undulations due to wiring steps and contact holes beneath the bolometer film since the metal wiring and the like are formed on a lower side of the bolometer film. At these positions of steps and contact holes, the bolometer film has crystal disturbance and grain boundary, which causes noise or characteristic deterioration.

Therefore, in the conventional infrared imaging device, since the bolometer film must be formed at a relatively low temperature, materials for the bolometer film are limited. Besides, by the undulations existing beneath the bolometer film, noise and characteristic deterioration are caused. It was hence difficult to obtain an infrared imaging device of high performance.

BRIEF SUMMARY OF THE INVENTION

A first aspect of the invention, there is provided an imaging device comprising: a select line; a first signal line crossing the select line; and a first pixel provided at a portion corresponding to a crossing portion of the select line and the first signal line; the first pixel comprising: a first buffer layer formed on a substrate; a first bolometer film formed on the first buffer layer, made of a compound which undergoes metal-insulator transition, and generating a first temperature detection signal; a first switching element formed on the substrate, selected by a select signal from the select line, and supplying the first temperature detection signal to the first signal line; and a metal wiring connecting a top surface of the first bolometer film to the first switching element.

A second aspect of the invention, there is provided an imaging device comprising: a first select line; a first signal line crossing the first select line; a first pixel provided at a portion corresponding to a crossing portion of the first select line and the first signal line, the first pixel comprising a first bolometer film generating a first temperature detection signal, and a first switching element selected by a first select signal from the first select line and supplying the first temperature detection signal to the first signal line; a second signal line crossing the first select line; a second pixel provided at a portion corresponding to a crossing portion of the first select line and the second signal line, the second pixel comprising a second bolometer film generating a second temperature detection signal, and a second switching element selected by the first select signal and supplying the second temperature detection signal to the second signal line; and a control circuit controlling a width of the first select signal in accordance with the second temperature detection signal.

A third aspect of the invention, there is provided a method of manufacturing an imaging device, comprising: forming a buffer layer on a substrate; forming a bolometer film made of a compound which undergoes metal-insulator transition, on the buffer layer; forming a switching element on the substrate after forming the bolometer film; and forming a metal wiring to connect the bolometer film to the switching element after forming the bolometer film.

BRIEF DESCRIPTION OF THE SEVERAL VIEWS OF THE DRAWING

FIG. 4A to FIG. 4C are views showing a method of manufacturing an infrared imaging device according to an embodiment of the invention.

FIG. 10 is a schematic diagram of a molecular beam epitaxy apparatus for use in manufacturing the infrared imaging device according to the embodiment of the invention.

FIG. 11 is a view showing temperature dependence of resistivity and temperature dependence of TCR, in the bolometer film of the infrared imaging device according to the embodiment of the invention.

FIG. 12 is a view showing substrate temperature dependence of TCR when using a $LaAlO_3$ substrate, in the bolometer film of the infrared imaging device according to the embodiment of the invention.

FIG. 13 is a view showing $O_3$/Ni supply ratio dependence of TCR, in the bolometer film of the infrared imaging device according to the embodiment of the invention.

FIG. 16 is a diagram showing oxygen partial pressure dependence of XRD intensity, in the bolometer film of the infrared imaging device according to the embodiment of the invention.

FIG. 17 is a view showing temperature dependence of resistivity and temperature dependence of TCR, in the bolometer film of the infrared imaging device according to the embodiment of the invention.

DETAILED DESCRIPTION OF THE INVENTION

Figure 1:
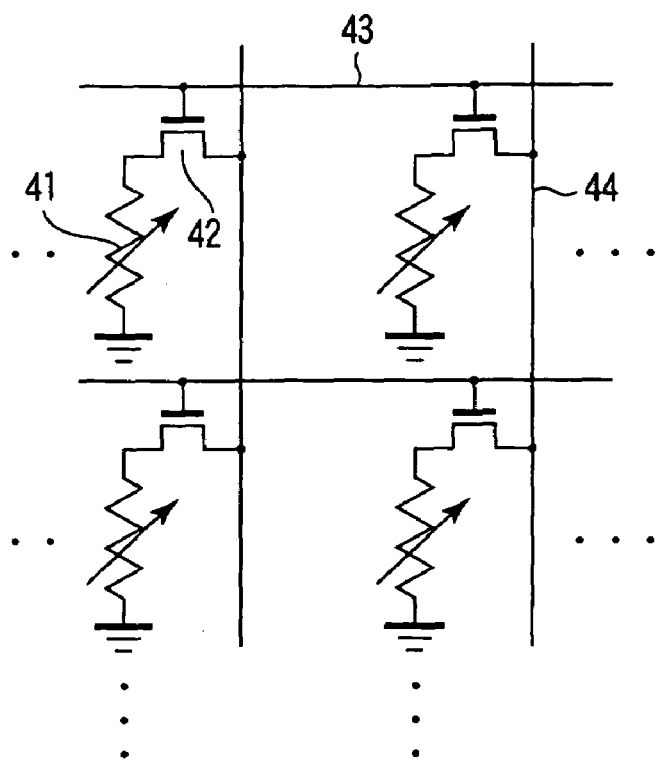
FIG. 1 is a diagram showing an equivalent circuit of an infrared imaging device according to an embodiment of the invention.

First of all, general matters about the embodiment of the invention will be described below.

The performance of a bolometer film is generally expressed by TCR (temperature coefficient of resistance). Assuming the resistance of the bolometer film at temperature T to be R, TCR is expressed as follows.

$$TCR = (1/R)(dR/dT)$$

For infrared detection at higher sensitivity than before, it should be preferably |TCR|>3%/K, and more preferably |TCR|>4%/K. For lower cost and higher resolution, the pixel pitch should be smaller than before, for example, about 15 $\mu$m. However, when the pixel pitch is reduced, the incident thermal energy in one pixel is reduced. As a result, the sensitivity is lowered, and the value of NETD (noise equivalent temperature difference) increases. When using the bolometer film in a high sensitivity infrared camera, the NETD value is preferred to be 60 to 100 mK. To achieve the NETD value of 60 to 100 mK at the pixel pitch of 15 $\mu$m, it is difficult with the conventional vanadium oxide bolometer film. That is, to achieve the NETD value of 60 to 100 mK at the pixel pitch of 15 $\mu$m, the bolometer sensitivity must be not less than two times higher than conventional one. Besides, since the bolometer temperature is raised more than the room temperature by the pulse bias current when measuring the bolometer resistance, it is preferred to realize |TCR|>3%/K in a temperature range of 300 to 350 K.

Bolometer materials having such characteristic include compound crystals showing metal-insulator transition, in particular, the following two types of compound crystals.

(1) $RNiO_{3-d}$ (where R is at least one element selected from Pr, Nd, Sm, Eu and Bi, and d is a value showing deviation from the stoichiometry of oxygen, which is usually $-0.1 \leq d \leq 0.2$). A representative example is $Sm_{1-x}A_yNi_yO_{3-d}$ (where A is Nd or Bi, $0 \leq x \leq 0.5$, $0.9 < y < 1.1$).

(2) $Ca_{2-x}Sr_xRuO_{4-d}$ (where d is a value showing deviation from the stoichiometry of oxygen, which is usually $-0.1 \leq d \leq 0.2$, $0 \leq x \leq 0.05$), or $Ca_{2-x}RuO_{4-d}$ (where d is a value showing deviation from the stoichiometry of oxygen, which is usually $-0.1 \leq d \leq 0.2$, $0 < x < 0.32$).

In these bolometer materials, the TCR value at around metal-insulator transition is sufficiently large so as to obtain an infrared imaging device of high sensitivity. In these bolometer materials, by optimizing the forming condition and composition, the metal-insulator transition occurs at a temperature suited to a non-cooled type infrared imaging device ($T_{MI}$=320 to 410 K). Herein, the $T_{MI}$ is the metal-insulator transition temperature, and it is defined by the temperature at which the sign of the TCR is changed.

In bulk $SmNiO_3$, metal-insulator transition occurs at $T_{MI}$=403 K, and the $T_{MI}$ is lowered when part of Sm is replaced by Nd, as disclosed by J. B. Torrance et al. in Phys. Rev. B, 45, p. 8209 (1992). The present inventor has succeeded in achieving metal-insulator transition at the room temperature or more for the first time in a thin film of $RNiO_{3-d}$, and has made it possible to apply to the infrared imaging device.

As a result of experiment by using $Sm_{1-x}A_xNi_yO_{3-d}$ having the perovskite structure, in order to obtain |TCR|>3%/K at the room temperature or more, it was found that the following condition is needed. Ultimately, a |TCR| value of more than 6%/K was obtained at the room temperature or more.

(1) Concerning deviation of composition ratio of site A element and site B element in the perovskite structure, $0.9 < y$ is needed.

(2) The required film forming temperature is 550° C. or more.

(3) In the molecular beam epitaxy method, when O3 gas is used as oxidizing gas, the $O_3$ flux is required to be not less than 30 times of Ni flux.

(4) When the underlying layer is $SrTiO_3$ or $NdGaO_3$, the metal-insulator transition rarely occurs, and when the underlying layer is $LaAlO_3$, the metal-insulator transition is successfully obtained.

(5) The $SmNi_yO_{3-d}$ film has $T_{MI}$ of 400 to 410 K, and the transition temperature is relatively high. By lowering the $T_{MI}$, holding temperature of the element can be brought closer to the room temperature, and it is easier to use and the cost is lowered. To lower the $T_{MI}$, it is found effective to replace part of Sm with Bi (A=Bi). Substitution amount x is preferred to be $0 < x < 0.09$. Since Bi and Bi oxide are low in melting point, the process temperature can be lowered by replacing part of Sm with Bi.

In bulk $Ca_2RuO_4$, metal-insulator transition occurs at $T_{MI}$=357 K, as disclosed by C. S. Alexander et al. in Phys. Rev. B, 60, p. 8422 (1999). By replacing part of Ca with La or Sr, the $T_{MI}$ and resistivity are lowered, as disclosed by G. Gao et al. in Phys. Rev. B, 61, p. 5053 (2000). The present inventor has succeeded in achieving of metal-insulator transition for the first time in a thin film of $Ca_2RuO_4$, and has made it possible to apply to the infrared imaging device.

As a result of experiment by using $Ca_{2-x}RuO_{4-d}$ having the layered perovskite structure, in order to obtain the metal-insulator transition, it was found that the following condition is needed.

(1) When the underlying layer is $SrTiO_3$ or $NdGaO_3$, the metal-insulator transition rarely occurs, and when the underlying layer is $LaAlO_3$, the metal-insulator transition is successfully obtained.

(2) First an amorphous film is formed, and then a heat treatment is performed to obtain a desired crystal structure.

(3) To obtain a desired crystal structure, it is required to heat in a mixed atmosphere of inert gas and oxygen gas of 0.05% or more and less than 1%, in a temperature range of 990° C. and 1050° C.

(4) Before this heat treatment, it is preferred to heat for 10 hours or more in oxygen gas atmosphere at 700 to 800° C.

(5) $Ca_2RuO_4$ has a relatively high phase transition temperature of $T_{MI}$=357 K. By lowering the $T_{MI}$, holding temperature of the element can be brought closer to room temperature, and it is easier to use and the cost is lowered. To lower the $T_{MI}$, it is effective to lose part of Ca. The loss amount x is preferred to be 0<x<0.32. By lowering the $T_{MI}$ by Ca loss, the $T_{MI}$ can be adjusted without introducing Sr.

In these two types of bolometer materials, in order to obtain a desired crystal structure for achieving metal-insulator transition, a high temperature process at 450° C. or more is needed. Accordingly, the conventional method of manufacturing an infrared imaging device could not be applied. In this embodiment, before forming ROIC (read-out integrated circuit) including transistor and metal wiring on a semiconductor substrate, a bolometer film is formed. As a result, the high performance of these materials can be utilized.

Further, in these two materials, in order to achieve metal-insulator transition, selection of the underlying layer is important. It is preferred that first, a buffer layer is formed on the semiconductor substrate (Si substrate), and then a bolometer film is formed thereon. It is also preferred to form a buffer layer in two layers as described below.

A first layer is preferably a thin film of oxide epitaxially grown on a silicon substrate. The crystal structure of this oxide is preferably the perovskite structure, fluorite structure, or C-type rare earth structure. It is also preferred that the lattice of a first buffer layer is matched to a certain extent with the lattice of a second buffer layer, and the lattice mismatch is preferably within ±10%. For example, the first buffer layer is $SrTiO_3$ (100) orientation film, $CeO_2$ (100) orientation film, or $RE_2O_3$ (100) orientation film (where RE is a trivalent rare-earth element or Y), epitaxially grown on the Si (100) substrate.

A second buffer layer is preferred to be a thin film of oxide epitaxially grown on the first buffer layer. The crystal structure of this oxide is preferred to belong to perovskite family. The lattice of the second buffer layer is preferred to be matched sufficiently with the lattice of a bolometer film, and the lattice mismatch is preferably within ±2.5%. For example, the second buffer layer is a $LaAlO_3$ film. The thickness of the second buffer layer is preferred to be thick enough to obtain its proper lattice constant without having effect of the lattice constant of the first buffer layer, and is preferably 50 nm or more (more preferably 100 nm or more).

In this embodiment, as the buffer layer, first, the $SrTiO_3$ (100) orientation film is epitaxially grown on the Si (100) substrate, and then the $LaAlO_3$ (100) orientation film is grown epitaxially. The technology of direct epitaxial growth of $SrTiO_3$ on the Si (100) substrate is disclosed, for example, by R. A, McKee et al., Phys. Rev. Lett. 81, p. 3014 (1998). The $SrTiO_3$ (100) orientation film functions as a seed layer for epitaxial growth of perovskite oxide on Si. Accordingly, the thickness of the $SrTiO_3$ (100) orientation film is enough at 3 unit cells or more, and typically it is 2 nm. The $LaAlO_3$ (100) orientation film is required to have a surface lattice constant closer to the lattice constant of bulk such that the lattice mismatch to the bolometer film is a proper value. From such viewpoint, the thickness of the $LaAlO_3$ (100) orientation film is preferred to be 50 nm or more, and typically it is 100 nm.

When reading a signal from the infrared imaging device, the resistance of the bolometer film is measured by passing pulse current in the bolometer film. Assuming the hold temperature of the bolometer film to be $T_S$, the self-heating temperature $dT_S$ by reading current is 3 to 70 K (typically 10 to 20 K). By contrast, the temperature rise $dT_{IR}$ by infrared ray is the order of mK. In metal-insulator transition, as shown in FIG. 11, the TCR has a temperature dependence, and the temperature rang allowing large absolute values of TCR is narrow. Therefore, to measure at high sensitivity, the temperature $T_P$ where the absolute value of TCR reaches the peak should be somewhere between $T_S$ and $T_S+dT_S$. The peak temperature $T_P$ is preferred to be about the middle point of $T_S$ and $T_S+dT_S$, or slightly closer to $T_S+dT_S$ rather than $T_S$. To satisfy such condition, the pulse width of reading current is preferred to be adjusted in every device or in every line within the device. The device is preferred to incorporate a pixel not sensitive to infrared ray (insensitive pixel). In this case, the resistance change of the bolometer film in the insensitive pixel is detected, and the reading pulse width in ordinary pixel is determined on the basis of the detection signal. As a result, it is possible to detect always near the peak temperature $T_P$, and an imaging device of high sensitivity is realized.

Figure 3:
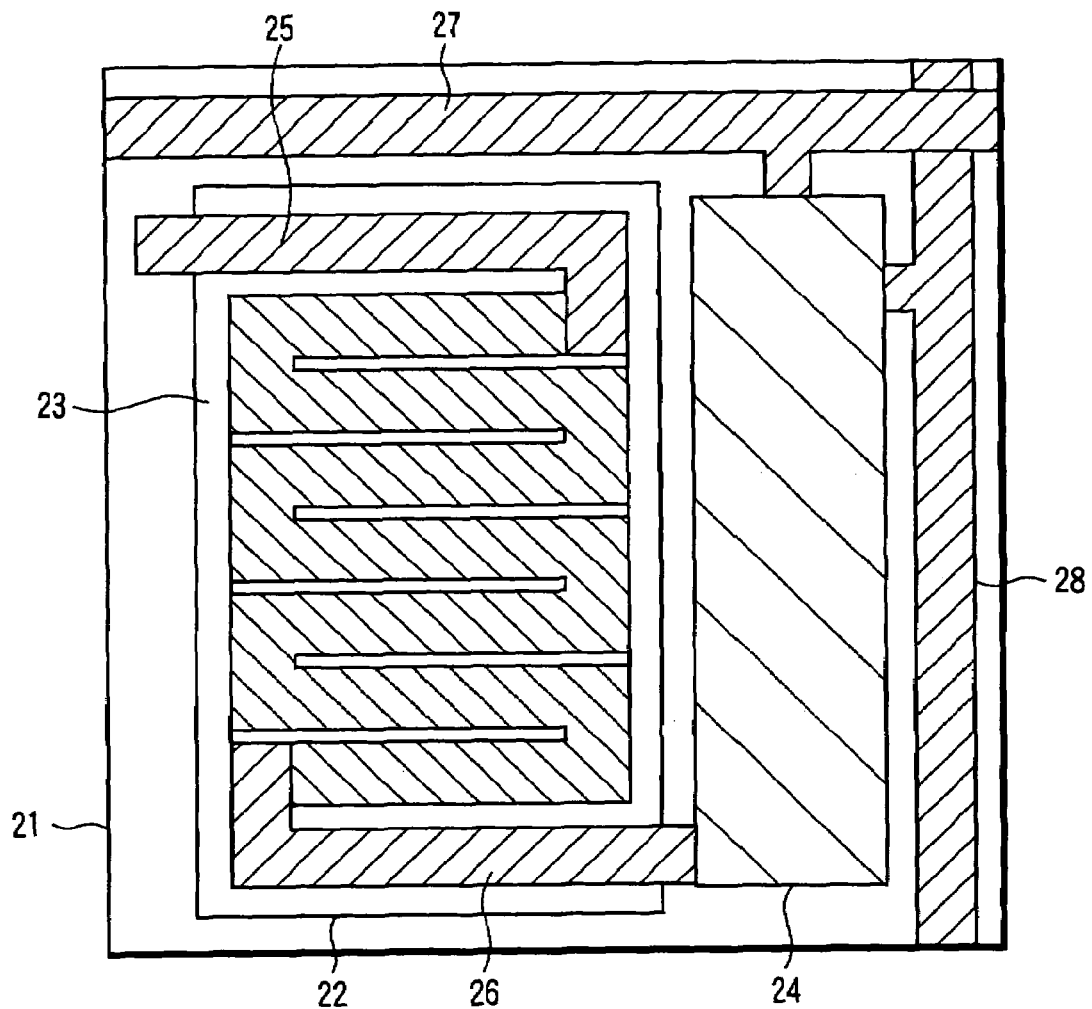
FIG. 3 is a view showing a plane structure of the pixel of the infrared imaging device according to the embodiment of the invention.

To detect at high sensitivity in an infrared imaging device, the pulse current is preferred to be 10 to 100 $\mu A$, and the voltage generated by the detection pulse is preferred to be 1 to 10V. Therefore, the resistance value of the bolometer film in one pixel is preferably 10 to 100 k$\Omega$. As shown in FIG. 11, the resistivity of $Sm_{1-x}A_xNi_yO_{3-d}$ is about $5 \times 10^{-4}$ to $5 \times 10^{-3}$ $\Omega$cm. A proper thickness of the bolometer film from the view points of sharp metal-insulator transition and proper thermal conductance is in a range of 30 to 200 nm, and it is typically 50 nm. Therefore, in order that the length/width ratio of the bolometer film may be 10 to 1000, as shown in FIG. 3 later, the bolometer film is preferred to be processed in a meandering shape. In the example shown later, the length/width ratio is about 47. In the example of $Ca_{2-x}Sr_xRuO_{4-d}$ shown in FIG. 17, the resistivity is about $4 \times 10^{-3}$ to $1 \times 10^{-2}$ $\Omega$cm. A proper thickness of the bolometer film from the view points of sharp metal-insulator transition and proper thermal conductance is in a range of 30 to 200 nm, and it is typically 80 nm. It is hence desired to process the bolometer film in a meandering shape such that the length/width ratio of the bolometer is 8 to 200.

Referring now to the drawings, embodiments of the invention are described in detail below.

FIG. 1 is an equivalent circuit diagram of a non-cooled type infrared imaging device of the embodiment. Each pixel portion has a temperature detecting portion (heat sensitive portion) 41 using a bolometer film, and a MIS transistor (switching element) 42. A select line 43 is connected to the gate of each transistor 42 provided in the row direction, and a read line (signal line) 44 is connected to the drain of each transistor 42 provided in the column direction.

Figure 2:
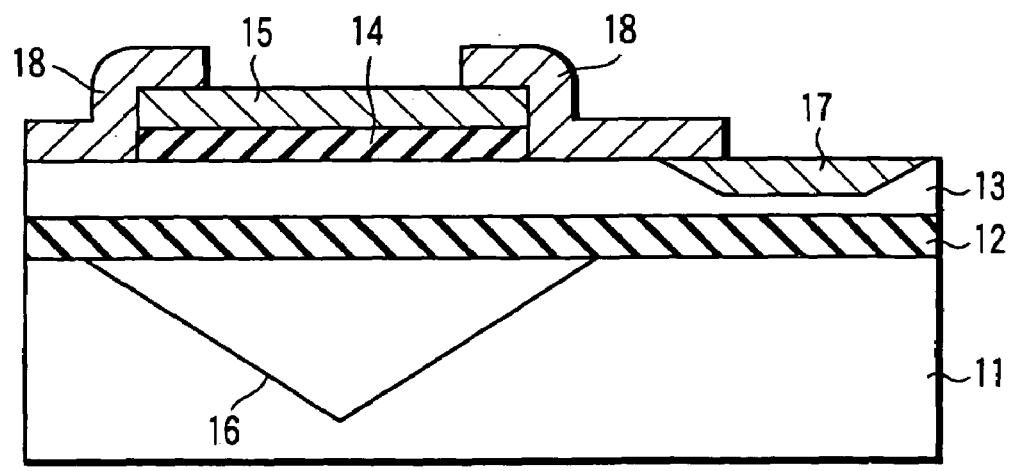
FIG. 2 is a view showing a sectional structure of a pixel of the infrared imaging device according to the embodiment of the invention.

FIG. 2 is a sectional view of the pixel portion of the infrared imaging device.

In the example shown in FIG. 2, an insulating layer 12 is formed on a silicon substrate (semiconductor substrate) 11 which is a support substrate, and a silicon layer (semiconductor layer) 13 is formed on the insulating layer 12, thereby composing a so-called SOI substrate. Further, a buffer layer 14 of an insulating layer is formed on the silicon layer 13, and a bolometer film 15 is formed on the buffer layer 14. The bolometer film 15 is formed by using any of the materials mentioned above, that is, $Sm_{1-x}A_xNi_yO_{3-d}$, $Ca_{2-x}Sr_xRuO_{4-d}$, or $Ca_{2-x}RuO_{4-d}$. The buffer layer 14 is a stacked film of $SrTiO_3$ and $LaAlO_3$.

Beneath the bolometer film 15, a hollow space 16 is formed by removing part of the silicon substrate 11. This hollow space 16 is for thermally isolating the bolometer film 15. A MIS transistor portion (MIS transistor forming region) 17 is provided on the silicon layer 13. A metal wiring (for example, Al wiring) 18 is connected to one end of the bolometer film 15, and by this metal wiring 18, the bolometer film 15 and the source of the MIS transistor 17 are connected with each other. The other end of the bolometer film 15 is grounded by way of the metal wiring 18.

As shown in FIG. 2, the metal wiring 18 contacts with the top of the bolometer film 15. That is, the bolometer 15 has been already formed before forming the metal wiring. Accordingly, unlike the prior art, the bolometer film is not formed on the steps or undulations of the metal wiring, but is formed on a flat surface of the buffer layer 14. It is hence free from disorder of crystal or grain boundary in the bolometer film due to steps or undulations. Therefore, the bolometer film excellent in crystallinity is obtained, and occurrence of noise and deterioration of characteristic can be prevented.

FIG. 3 shows a plane structure of the pixel portion of the infrared imaging device having the basic structure as shown in FIG. 2.

In FIG. 3, reference numeral 21 is a SOI substrate, 22 is a hollow pattern, 23 is a meandering bolometer film pattern, 24 is a MIS transistor portion (MIS transistor forming region), and 25 to 28 are wirings. The wiring 26 is for connecting between one end of the bolometer film 23 and source of the MIS transistor 24. The wiring 25 is for grounding the other end of the bolometer film 23. The wiring 27 corresponds to a select line, and is connected to the gate of the MIS transistor 24. The wiring 28 corresponds to a read line (signal line), and is connected to the drain of the MIS transistor 24.

The size of one pixel is, for example, about 50 $\mu$m×50 $\mu$m to 15 $\mu$m×15 $\mu$m. A smaller chip area leads to reduction of cost, and there is an increasing demand for high resolution and multiple pixels, thereby the size of one pixel is preferred to be about 15 $\mu$m×15 $\mu$m. Since the wavelength of the infrared ray to be detected is about 8 to 14 $\mu$m, it is meaningless to define the pixel pitch of 10 $\mu$m or less from the viewpoint of diffraction limit. The number of pixels is, for example, 320×240, and 640×480, for example, where a high resolution is demanded.

As shown in FIG. 3, when the bolometer film portion (detecting portion) and transistor portion are formed adjacently to each other, the rate of the detecting portion area to the pixel area (fill factor) becomes smaller. In the example in FIG. 3, the fill factor is about 25%. When the fill factor drops, the sensitivity decreases. To compensate for this loss, it is effective to form an infrared ray absorption portion of umbrella structure above the substrate in every pixel. This is disclosed in Japanese Patent No. 3040356. By employing this technology, the fill factor can be improved to 90% or more, nearly to 100%, and an infrared imaging device of high sensitivity is obtained.

FIG. 4A to FIG. 4C show a method of manufacturing the infrared imaging device shown in FIG. 2.

First, as shown in FIG. 4A, on the SOI substrate composed of the silicon substrate 11, insulating film 12 and silicon layer 13, the buffer layer 14 (stacked film of $SrTiO_3$/$LaAlO_3$) is grown epitaxially. In succession, on the buffer layer 14, the bolometer film 15 (using $Sm_{1-x}A_xNi_yO_{3-d}$, $Ca_{2-x}Sr_xRuO_{4-d}$, or $Ca_{2-x}RuO_{4-d}$) is formed in a high temperature process as mentioned above.

Next, as shown in FIG. 4B, the bolometer film 15 and buffer layer 14 are processed in a required shape. Further, the transistor 17 is formed on the silicon layer 13, and further the metal wiring (for example, Al wiring) 18 is formed. By this metal wiring 18, the bolometer film 15 and transistor 17 are connected with each other.

As shown in FIG. 4C, part of the silicon substrate 11 is removed by anisotropic etching, the hollow space 16 having such a pattern that includes the pattern of the bolometer film 15. At this time, the insulating layer 12 functions as an etching stopper.

In this embodiment, the bolometer film 15 is formed in the high temperature process as mentioned above, and this bolometer film 15 is formed before formation of the transistor 17 and metal wiring 18. Accordingly, the transistor 17 and metal wiring 18 are not exposed to high temperature in the process of forming the bolometer film 15. Therefore, when the material requiring high film forming temperature is used in the bolometer film, unlike the prior art, it is free from deterioration of metal wiring or transistor characteristic, so that an infrared imaging device excellent in performance is obtained.

Figure 5:
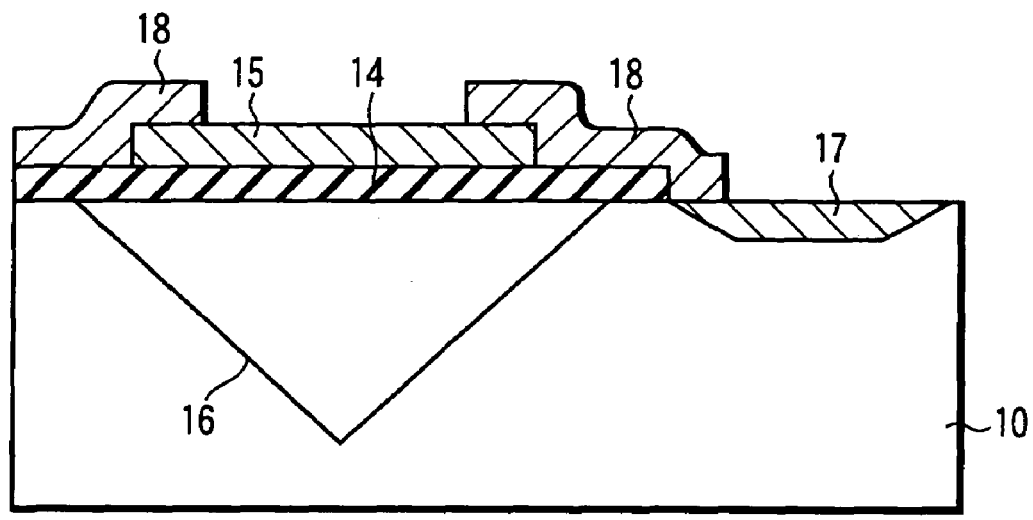
FIG. 5 is a view showing a sectional structure of a pixel in a modified example of the infrared imaging device according to the embodiment of the invention.

FIG. 5 shows another example of the infrared imaging device in the embodiment of the invention. Basically it is same as explained above, except that a bulk Si substrate 10 is used instead of the SOI substrate. In this example, the buffer layer 14 is used as an etching stopper when forming the hollow space 16 by anisotropic etching. The anisotropic etching is performed by a wet etching process using tetramethyl ammonium hydroxide or the like as an etchant. When the buffer layer 14 is used as an etching stopper, a thick buffer layer is needed in order to support the hollow structure. Hence, the thickness of the buffer layer 14 is about 0.5 $\mu$m or more, preferably about 0.8 $\mu$m.

Thus, in the example shown in FIG. 5, since the buffer layer 14 is used as an etching stopper, an ordinary inexpensive bulk Si substrate can be used as compared with the SOI substrate, and the manufacturing cost can be reduced.

Figure 6:
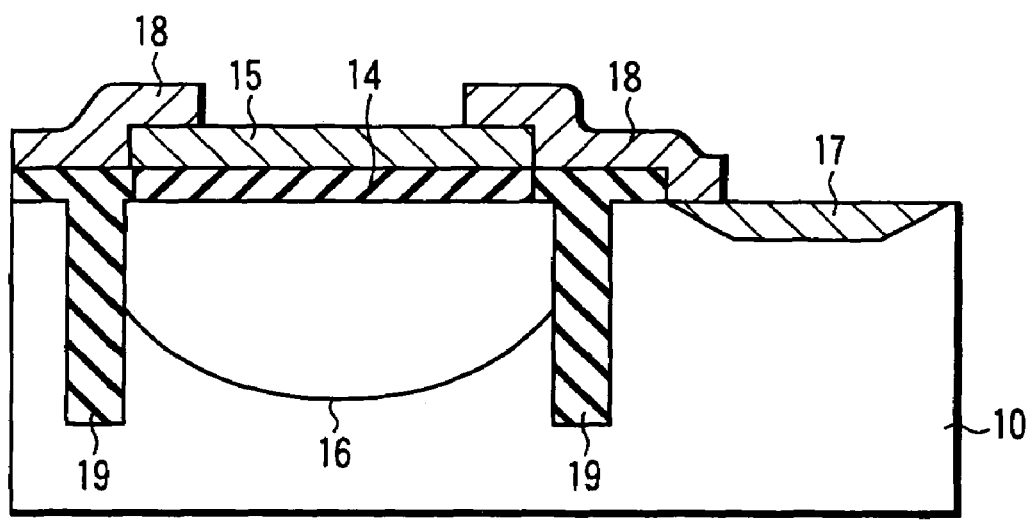
FIG. 6 is a view showing a sectional structure of a pixel in another modified example of the infrared imaging device according to the embodiment of the invention.

FIG. 6 shows another example of the infrared imaging device in the embodiment of the invention. Basically it is same as explained above, except that a bulk Si substrate 10 is also used instead of the SOI substrate. Further in this example, an etching stop layer 19 formed of a silicon oxide film ($SiO_2$ film) or the like is provided. By using this etching stop layer 19 and buffer layer 14 as etching stoppers, the hollow space 16 is formed by isotropic etching. The isotropic etching is performed by a dry etching process using $XeFe_2$ or the like as etching gas.

It is also possible to use a SON (silicon on nothing) substrate. The method of fabricating the SON substrate is disclosed by Ichiro Mizushima et al. in Applied Physics, October 2000, p. 1187 (in Japanese, published by Japanese society of applied physics). By forming a trench in a bulk Si substrate and heating in hydrogen atmosphere at about 1100° C., an Empty Space in Silicon (ESS) can be formed. By applying this technique, a hollow structure (hollow space) can be formed.

Figure 7:
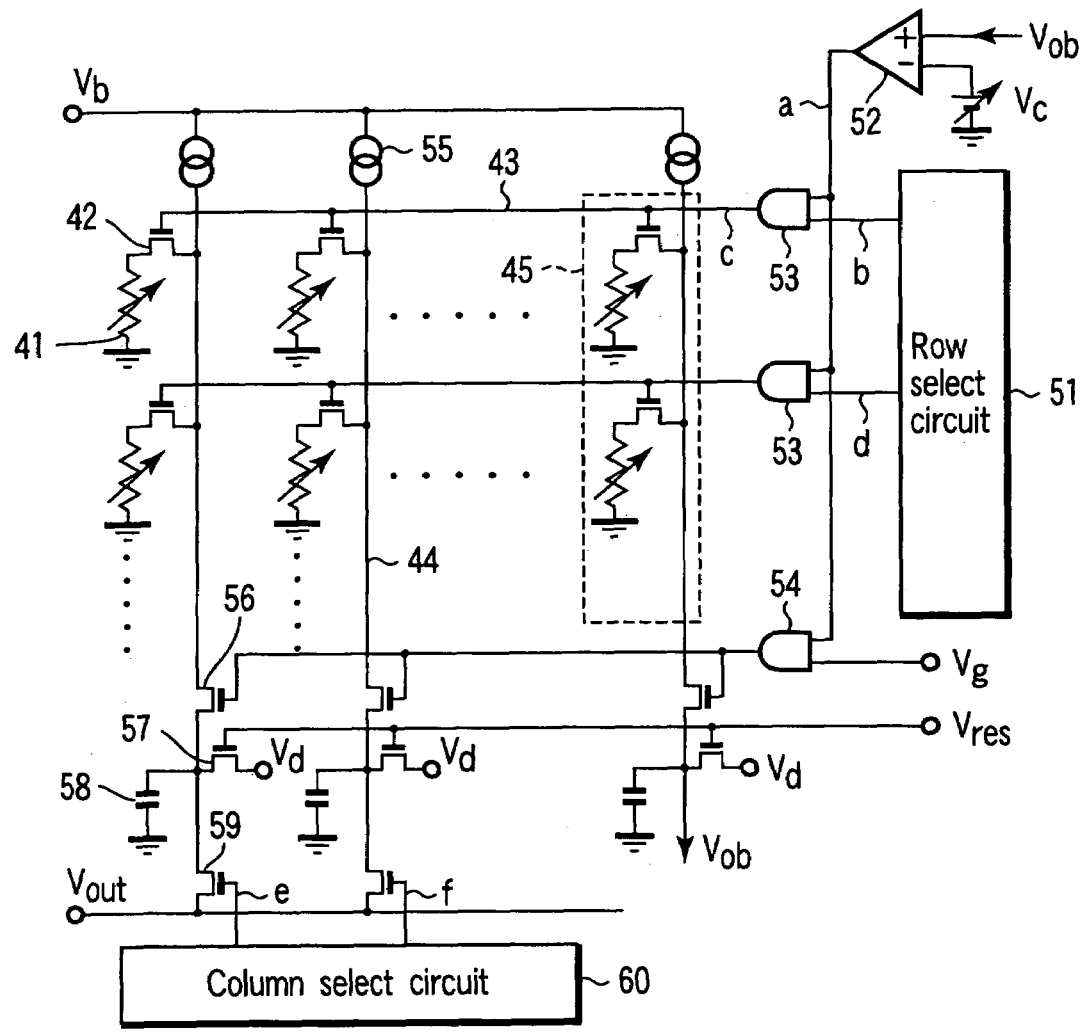
FIG. 7 is a diagram showing a circuit structure of an entire infrared imaging device according to the embodiment of the invention.
Figure 8:
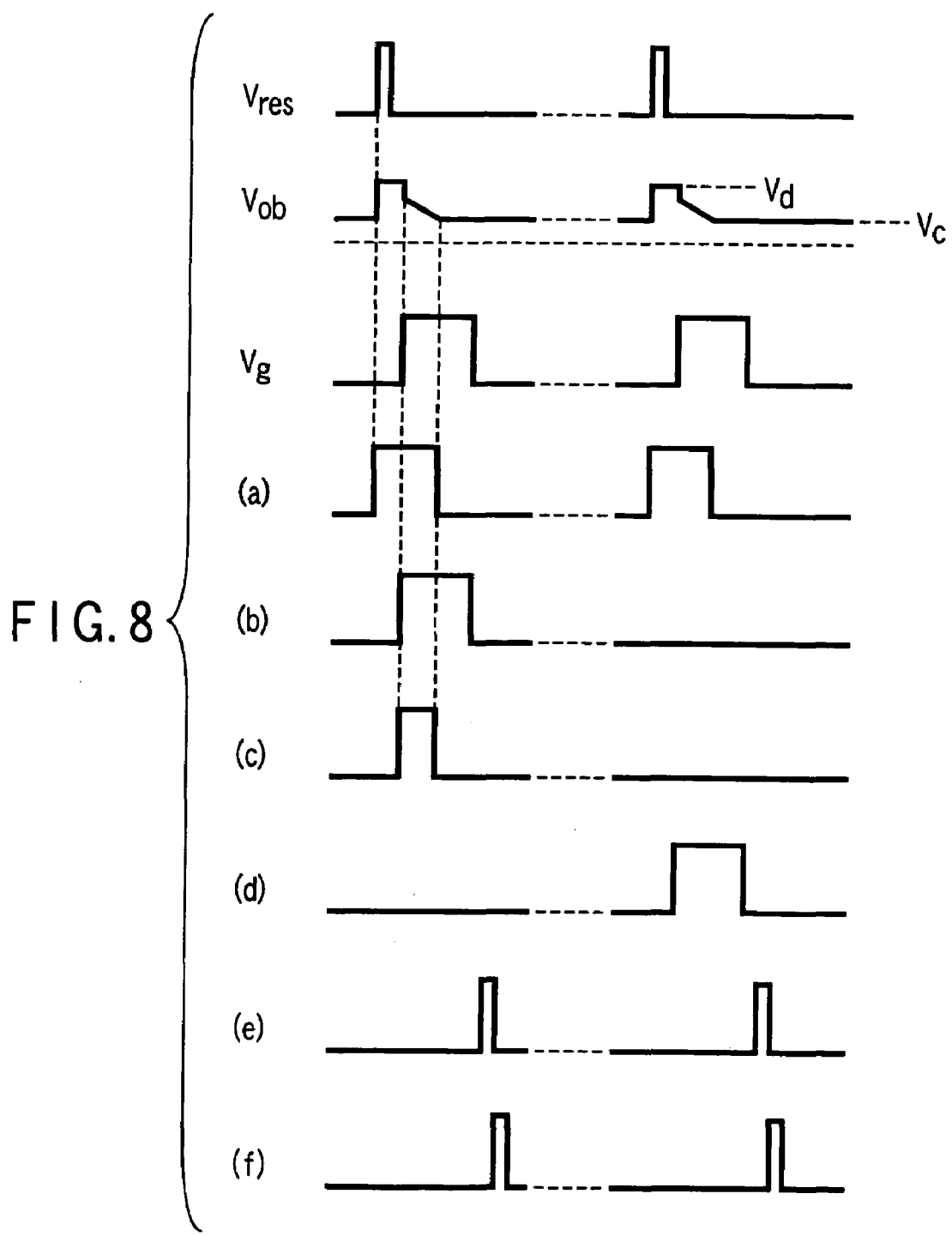
FIG. 8 is a view showing signal waveforms of the circuit shown in FIG. 7.
Figure 9:
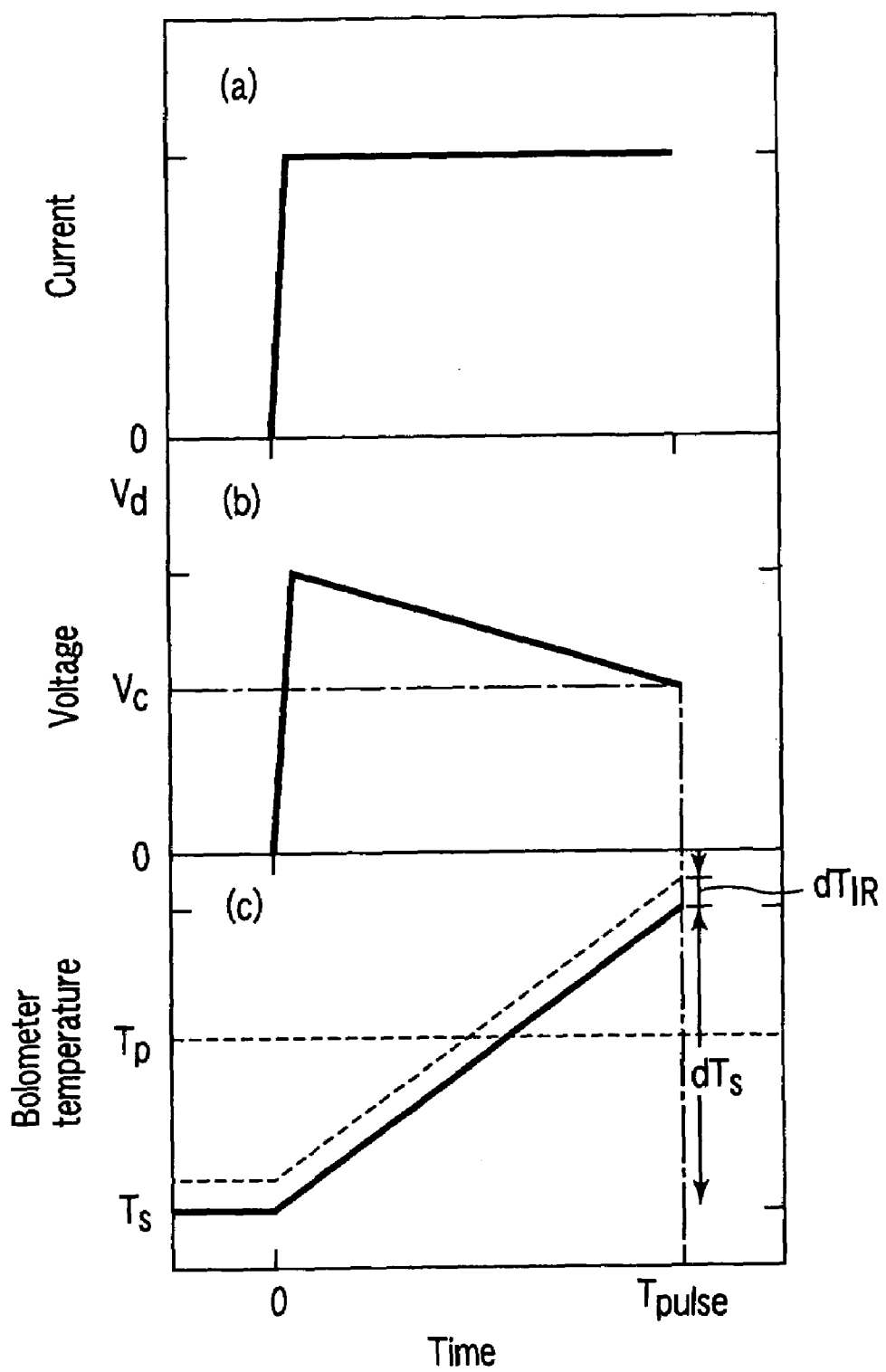
FIG. 9 is a view showing the driving principle of the infrared imaging device according to the embodiment of the invention.

An example of a method of driving the infrared imaging device according to the embodiment of the invention will be explained by referring to FIG. 7 to FIG. 9. FIG. 7 is a diagram showing an example of the infrared imaging device including peripheral circuits such as driving circuit, FIG. 8 is a view showing signal waveforms of the circuits shown in FIG. 7, and FIG. 9 is a view showing the driving principle of the infrared imaging device. In FIG. 8, the axis of abscissas is the time and the axis of ordinates represents the voltage.

The resistance of the bolometer film varies with temperature changes due to infrared irradiation. Optimization of reading pulse width, when reading a signal corresponding to such resistance changes, is explained by referring to FIG. 9. The pulse width is typically about 10 to 100 $\mu$sec.

Schematically, (a) in FIG. 9 shows the reading current flowing in the bolometer film, (b) in FIG. 9 shows voltage changes of the bolometer film caused by the reading current, and (c) in FIG. 9 shows temperature changes of the bolometer film caused by the reading current.

When a current flows in the bolometer, the temperature (c) of the bolometer film gradually elevates by self-heating. Using a bolometer film of TCR<0, the voltage (b) applied between both ends of the bolometer film decreases with increasing temperature. The dotted line in (c) schematically shows temperature changes of the bolometer film in the case of a continuous incidence of infrared ray into the pixel portion. The temperature rise based on infrared ray is $dT_{IR}$. Assuming the initial temperature (hold temperature) of the bolometer film to be $T_S$, the temperature rise caused by self heating by reading current pulse is $dT_S$. In metal-insulator transition, for example as explained later in FIG. 11, the TCR is dependent on temperature. It is hence desired to optimize the reading current pulse width such that the temperature $T_P$ where the absolute value of the TCR reaches the peak is the optimum temperature between $T_S$ and $T_S+dT_S$. The hold temperature $T_S$ varies with the reading current value and pulse width, thermal time constant of heat sensitive part (detecting portion), and ambient temperature. The peak temperature $T_P$ may fluctuate between devices or in a device. It is hence desired to adjust the reading current pulse width for each device or for each row line in the device. A specific method will be explained below.

In FIG. 7, the basic structure of the pixel portion including the detecting portion 41 using the bolometer film and MIS transistor 42, and the basic structure of the select line 43 and read line (signal line) 44 are as already explained. In this example, plural pixel portions provided in predetermined column are insensitive pixel column line (insensitive pixel group) 45. One method to make insensitive pixels is overcoating a metal reflection plate on the pixels to avoid incidence of infrared rays into the detecting portions 41.

The transistors 42 are selected sequentially by AND gates 53, each outputs operation result c of output b of a row select circuit 51 and output a of a comparator 52. The output of the comparator 52 is connected also to the AND gates 54. Current sources 55 are connected to the input portions of read lines (signal lines) 44, and transistors 56 are connected to the output portions of the read lines. The outputs of the transistors 56 are connected to transistors 57, capacitors 58, and transistors 59. The transistors 59 are sequentially selected by a control signal from a column select circuit 60.

Referring now to the timing chart shown in FIG. 8, the circuit operation in FIG. 7 is explained.

First, a reset signal $V_{res}$ is applied to each transistor 57. As a result, each capacitor 58 is charged with a power supply voltage $V_d$ through each transistor 57 being turned on. Terminal voltage $V_{ob}$ of the capacitor 58 corresponding to the insensitive pixel column line is supplied to the positive terminal of the comparator 52, and hence the output a of the comparator 52 becomes high level. A reference voltage $V_c$ is supplied to the negative terminal of the comparator 52. This reference voltage $V_C$ is predetermined for each device so that the pulse width of the read pulse c being output from the AND gate 53 may be optimized.

In a specific time after supply of reset signal $V_{res}$, select signal b is supplied to the AND gate 53 from the row select circuit 51. A select signal $V_g$ is supplied to the AND gate 54. The AND gate 53 outputs an AND signal (read pulse) c of output a of the comparator 52 and select signal b, and each transistor 42 of the corresponding row line is turned on. The AND gate 54 outputs an AND signal of output a of the comparator 52 and signal $V_g$, and each transistor 56 is turned on. Consequently, a current is supplied to the bolometer film (detecting portion 41) from the current source 55 by way of the transistor 42. As a result, a voltage is produced at one terminal of the bolometer film, and this terminal voltage is supplied to the capacitor 58 by way of the transistors 42 and 56. At this time, depending on the incident amount of infrared ray in each detecting portion 41, the terminal voltage of the bolometer film varies. The temperature of the bolometer film gradually rises by self-heating. In this example, since the TCR of the bolometer film is negative, the terminal voltage of the bolometer film decreases gradually with increasing temperature. Accordingly, the output voltage $V_{ob}$ of the transistor 57 corresponding to the insensitive pixel column line decreases along with the lapse of time.

When the voltage $V_{ob}$ becomes equal to the reference voltage $V_C$, the output a of the comparator 52 changes from high level to low level. Therefore, the outputs of the AND gates 53 and 54 also change from high level to low level. As a result, the transistors 42 and 56 are turned off, and signal reading from the detecting portion 41 is terminated. Thus, each capacitor 58 is charged with a voltage corresponding to the voltage signal from each detecting portion 41, that is, the voltage corresponding to the incident amount of infrared ray to each detecting portion 41.

After the select signal b and $V_g$ became low level, reading of the voltage charged in the capacitor 58 is started. First, the column select circuit 60 supplies a select signal e to the corresponding transistor 59, and the charged voltage of the corresponding capacitor 58 is read out through the selected transistor 59. In succession, the column select circuit 60 supplies a select signal f to the corresponding transistor 59, and the charged voltage of the corresponding capacitor 58 is read out through the selected transistor 59. Similarly, thereafter, each capacitor voltage for one row line is read out sequentially.

When reading of capacitor voltage for one row line is over, a reset signal $V_{res}$ is applied again in each transistor 57, and the signals are detected and read out similarly in the next line.

In this embodiment, by setting the reference voltage $V_c$ of the comparator 52 for each device, the read pulse width is optimized. Therefore, if the peak temperature of TCR fluctuates between devices or between lines due to variations of characteristic of bolometer film, the infrared ray can be detected near the peak temperature. Hence, even if using a bolometer film material narrow in a temperature range where a large value of TCR is obtained, the infrared ray can be detected securely at high precision.

Specific examples of this embodiment will be explained below.

EXAMPLE 1

A thin film of $Sm_{1-x}A_xNi_yO_{3-d}$ was fabricated by a molecular beam epitaxy (MBE) method.

FIG. 10 schematically shows a configuration of a molecular beam epitaxy apparatus.

As shown in FIG. 10, gas in a vacuum chamber 81 is exhausted by a cryopump. A substrate holder 82 is provided in the vacuum chamber 81, and a substrate 83 is placed on the substrate holder 82. The substrate holder 82 is heated by a heater 84.

Opposite to the substrate 83, plural Knudsen cells 85 are disposed, and a cell shutter 86 is provided with each Knudsen cell 85. Each Knudsen cell 85 is filled with constituent element of thin film formed in the following examples, that is, La, Al, Sm, Ni, Bi and Nd. Further, to obtain a thin oxide film, pure ozone gas ($O_3$ gas) stored in a liquid ozone bath 87 is injected from a nozzle 88, and supplied to the substrate 83. To form a proper thin film of $Sm_{1-x}A_xNi_yO_{3-d}$, $Ni^{3+}$ is needed, and a strong oxidizing condition is required. In this example, $Ni^{3+}$ could be successfully produced by using pure ozone gas which has very strong oxidizing power. The substrate temperature was 500 to 750° C. in the film forming process in this example. In the process of cooling to 200° C. after forming the film, ozone gas was supplied continuously to oxidize sufficiently.

First of all, the film forming condition for obtaining a single phase film of $SmNi_yO_{3-d}$ was studied. As a result of X-ray diffraction, at substrate temperature of 500° C., desired crystal structure was not obtained, and only an amorphous structure was produced. In the case of epitaxial growth at substrate temperature of 550 to 750° C., a single phase film of $SmNi_yO_{3-d}$ was formed. When a single crystal substrate of $LaAlO_3$ (100) was used in this substrate temperature range, metal-insulator transition occurred, and a large value of |TCR| was obtained.

FIG. 11 shows the temperature dependence of resistivity (a) and temperature dependence of TCR (b) in the case of typical material. In this material, the metal-insulator transition was obtained at about 410 K. The maximum absolute value of TCR exceeds 6%/K. This value is two times or more of the TCR value of the conventional vanadium oxide.

FIG. 12 shows the temperature dependence of TCR in the case of using $LaAlO_3$ substrate. At substrate temperature of 550 to 750° C., |TCR| exceeded 3%/K.

The dependence of TCR on the ozone gas flux was studied. FIG. 13 shows the dependence of TCR on the O3 molecular flux/Ni flux ratio in the case of using $LaAlO_3$ substrate. When the O3 molecular flux was 30 times or more of the Ni flux, |TCR| exceeded 3%/K. At this time, the O3 molecular flux on the substrate was 1.7 to $2.2 \times 10^{-5}$ mol·sec$^{-1}$·m$^{-2}$. The method of oxidization includes, beside the ozone gas oxidizing method, a method of generating oxygen plasma by high frequency discharge or electron cyclotron resonance, and oxidizing by using this oxygen plasma. In this case, when the active oxygen flux is 30 times or more of the Ni flux, a high value of |TCR| can be obtained.

When $SrTiO_3$ or $NdGaO_3$ was used as the substrate, metal-insulator transition was not obtained, and the value of |TCR| was small. By contrast, in the case of depositing $LaAlO_3$ film on the substrate as underlying layer about 100 nm by MBE method, a high value of |TCR|was obtained same as in the case of $LaAlO_3$ single crystal substrate.

Figure 14:
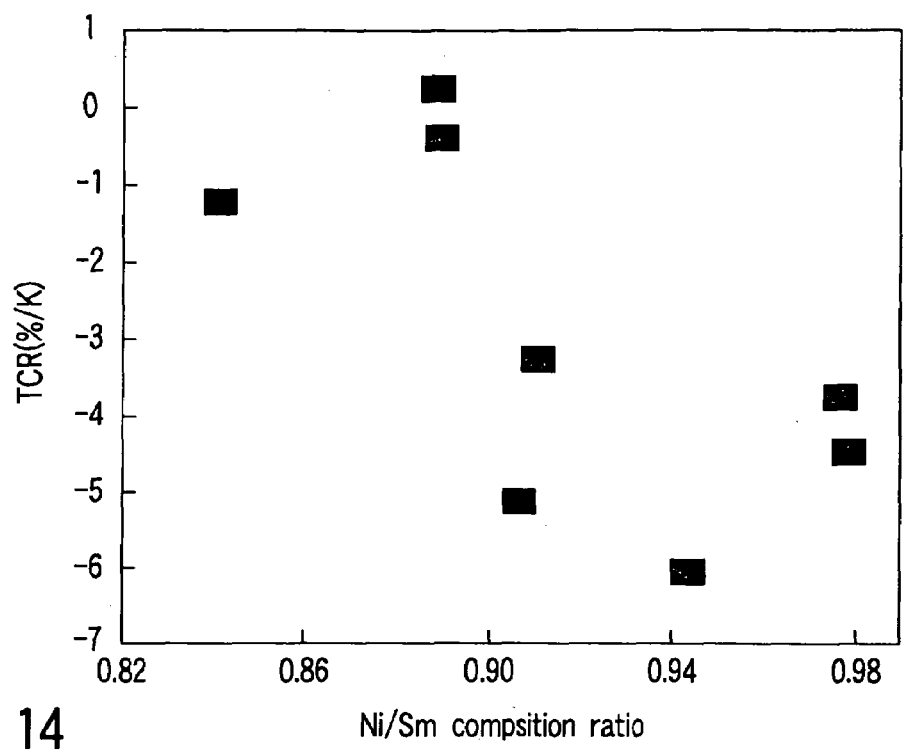
FIG. 14 is a view showing Ni/Sm composition ratio dependence of TCR, in the bolometer film of the infrared imaging device according to the embodiment of the invention.

In a compound having perovskite structure, the composition ratio of site A element and side B element is usually 1, but when a thin film is fabricated, the composition ratio is often deviated from 1. FIG. 14 shows the Ni/Sm composition ratio dependence of TCR. When the Ni/Sm composition ratio is 0.9 or less, the value of |TCR| drops. To obtain a value of |TCR| of 3%/K or more, 0.9<y is needed in $Sm_{1-x}A_xNi_yO_{3-d}$.

By replacing part of Sm with Bi, effects on $T_{MI}$ were studied. As a result of experiment, supposing Bi substitution amount to be x in $Sm_{1-x}Bi_xNi_yO_{3-d}$, $T_{MI}$ was found to be approximated by the following formula.

$$T_{MI}(K)=-1170x+403$$

To be applicable to a non-cooled type sensor, $T_{MI}$>300 K should be required. For this purpose, x must be less than 0.09. Assuming to hold the device at temperature $T_S$=300 K, and considering self-heating of bolometer film, 320 K$\leq T_{MI} \leq$350 K is preferred. Hence, $0.045 \leq x \leq 0.071$ is desired.

In this example, Knudsen cells are used as molecular beam supply source, but an electron beam evaporation method may be also used as means of molecular beam source. A thin film can be also formed by a method of supplying molecular beam of organic metal from Knudsen cell or gas source nozzle. In the example, the thin film was formed by molecular beam epitaxy method, but it may be also formed by sputtering method, laser ablation method, or chemical vapor deposition method (CVD method). In particular, the organic metal CVD method is preferable because it is suited to mass production.

EXAMPLE 2

A thin film of $Ca_2RuO_4$ was formed by RF sputtering method.

Using a $Ca_2RuO_4$ sinter target of 4 inches in diameter, RF power of 60 W was applied. The sputtering gas was a mixed gas of Ar 90%+$O_2$ 10%, the flow rate was 33 sccm, and the pressure was 1 Pa. The substrate temperature was room temperature.

Substrates were $SrTiO_3$ (100) single crystal substrate, $NdGaO_3$ (001) single crystal substrate, and $LaAlO_3$ (100) single crystal substrate. As a result, only in the case of using $LaAlO_3$ substrate and annealing at temperature of 975° C. or more after forming the film, $Ca_2RuO_4$ having a desired $K_2NiF_4$ type crystal structure was obtained.

Figure 15:
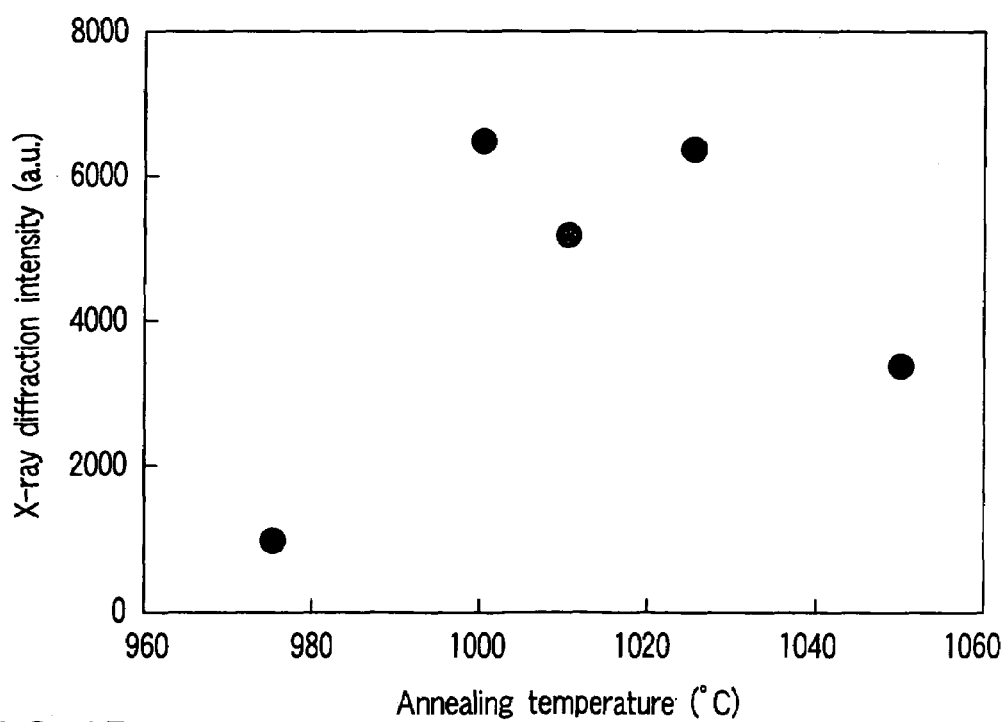
FIG. 15 is a view showing annealing temperature dependence of XRD intensity, in the bolometer film of the infrared imaging device according to the embodiment of the invention.

FIG. 15 shows the heat treatment temperature dependence of $Ca_2RuO_4$ (002) peak intensity of X-ray diffraction. When heated at 990° C. or more and 1050° C. or less, $Ca_2RuO_4$ of excellent crystallinity was obtained. If heated at 1050° C. or more, $Ca_3Ru_2O_7$ was mixed as impurity phase. When heated at less than 990° C., the amount of $CaRuO_3$ impurity phase increased. When heated at 990° C. or more and 1050° C. or less, metal-insulator transition was obtained. FIG. 15 shows results of heat treatment in a mixed gas of 99.5% of nitrogen gas and 0.5% of oxygen gas.

FIG. 16 shows the oxygen partial pressure dependence of $Ca_2RuO_4$ (002) peak intensity of X-ray diffraction. When the oxygen concentration was 0.05 to 1%, $Ca_2RuO_4$ with excellent crystallinity was obtained. As a result of measurement of temperature dependence of resistance, metal-insulator transition was obtained at the oxygen concentration of 0.05% and 0.5%, but metal-insulator transition was not obtained at oxygen concentration of 1%. Therefore, a proper oxygen concentration should be 0.05% or more and less than 1%. FIG. 15 shows results of heat treatment at temperature of 1010° C.

FIG. 17 shows the temperature dependence of resistivity (a) and temperature dependence of TCR (b) in the case of a typical material. In this material, the metal-insulator transition was obtained at about 248 K. In this material, the heat treatment for obtaining a desired crystal structure was conducted in 0.5% oxygen atmosphere for 30 minutes at 1010° C. As a result of chemical analysis of this material, the atomic ratio of Ca/Ru was 1.392. Owing to lack of Ca, the $T_{MI}$ was lower.

To lower the $T_{MI}$, it was found for the first time that it is effective to lose part of Ca. In $Ca_{2-x}RuO_{4-d}$, supposing the loss amount to be x, $T_{MI}$ was found to be approximated by the following formula.

$$T_{MI}(K) = -179x + 357$$

To be applicable to a non-cooled type sensor, $T_{MI} > 300$ K should be required. For this purpose, the loss amount x must be less than 0.32. Assuming to hold the device at temperature $T_S = 300$ K, and considering self-heating of bolometer film, 320 K $\leq T_{MI} \leq$ 350 K is preferred. Hence, $0.04 \leq x \leq 0.21$ is desired.

To enhance the characteristic by decreasing the amount of $CaRuO_3$ impurity phase, what is important is the process condition and sample state before the heat treatment for obtaining a desired crystal structure. To achieve metal-insulator transition by obtaining $Ca_2RuO_4$ with excellent crystallinity, the thin film right after sputtering is preferred to be amorphous. Accordingly, at the time of sputtering, it is preferred to hold the substrate at room temperature without heating. If sputtering is performed with heating the substrate, finally, the amount of $CaRuO_3$ impurity phase increases, and the characteristic becomes worse. By low temperature annealing after sputtering, the amount of $CaRuO_3$ of impurity phase is decreased. As a result, the crystallinity of $Ca_2RuO_4$ is improved, and a clear metal-insulator transition can be obtained. This low temperature annealing is preferred to be conducted at 700 to 800° C., for more than 10 hours in 100% oxygen gas atmosphere. If the annealing time is as short as 3 hours, effects are hardly obtained, and sufficient effects are obtained in about 24 hours.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An imaging device comprising:
   a first select line;
   a first signal line crossing the first select line;
   a first pixel provided at a portion corresponding to a crossing portion of the first select line and the first signal line, the first pixel comprising a first bolometer film generating a first temperature detection signal, and a first switching element selected by a first select signal from the first select line and supplying the first temperature detection signal to the first signal line;
   a second signal line crossing the first select line;
   a second pixel provided at a portion corresponding to a crossing portion of the first select line and the second signal line, the second pixel comprising a second bolometer film generating a second temperature detection signal, and a second switching element selected by the first select signal and supplying the second temperature detection signal to the second signal line; and
   a control circuit controlling a width of the first select signal in accordance with the second temperature detection signal.

2. The imaging device according to claim 1, wherein the first bolometer film does not detect infrared rays.

3. The imaging device according to claim 1, wherein the control circuit includes a comparator comparing a voltage of the second temperature detection signal with a predetermined voltage to generate the first select signal.

4. The imaging device according to claim 1, further comprising:
   a second select line crossing the first signal line and the second signal line;
   a third pixel provided at a portion corresponding to a crossing portion of the second select line and the first signal line, the third pixel comprising a third bolometer film generating a third temperature detection signal, and a third switching element selected by a second select signal from the second select line and supplying the third temperature detection signal to the first signal line; and
   a fourth pixel provided at a portion corresponding to a crossing portion of the second select line and the second signal line, the fourth pixel comprising a fourth bolometer film generating a fourth temperature detection signal, and a fourth switching element selected by the second select signal and supplying the fourth temperature detection signal to the second signal line;
   wherein the control circuit is configured to control a width of the second select signal in accordance with, the fourth temperature detection signal.

5. The imaging device according to claim 4, wherein the fourth bolometer film does not detect infrared rays.

6. The imaging device according to claim 1, wherein a plurality of first select lines cross a plurality of first signal lines and the second signal line, and a plurality of first pixels are provided at portions corresponding to crossing portions of the first select lines and the first signal lines, and a plurality of the second pixels are provided at portions corresponding to crossing portions of the first select lines and the second signal line.

7. The imaging device according to claim 1, wherein each of the first and second bolometer films is made of a compound which undergoes metal-insulator transition.

8. The imaging device according to claim 7, wherein the compound is expressed by $RNiO_{3-d}$, where R is at least one element selected from Pr, Nd, Sm, Eu and Bi, and d is a value showing deviation from stoichiometry.

9. The imaging device according to claim 8, wherein the value of d ranges from −0.1, inclusive, to 0.2, inclusive.

10. The imaging device according to claim 7, wherein the compound is expressed by $Ca_{2-x}Sr_xRuO_{4-d}$, where d is a value showing deviation from stoichiometry, and x ranges from 0, inclusive, to 0.05, inclusive, or by $Ca_{2-x'}RuO_{4-d'}$, where d' is a value showing deviation from stoichiometry, and x' is greater than 0 and smaller than 0.32.

11. The imaging device according to claim 10, wherein the value of d ranges from −0.1, inclusive, to 0.2, inclusive, and the value of d' ranges from −0.1, inclusive, to 0.2, inclusive.

12. The imaging device according to claim 1, wherein a maximum absolute value of a temperature coefficient of resistance of each of the first and second bolometer films is more than 3%.

13. The imaging device according to claim 1, wherein each of the first and second bolometer films is made of an epitaxial film.

* * * * *